(12) United States Patent
Oka et al.

(10) Patent No.: US 8,497,187 B2
(45) Date of Patent: Jul. 30, 2013

(54) METHOD FOR MANUFACTURING SOI WAFER AND SOI WAFER

(75) Inventors: Satoshi Oka, Annaka (JP); Susumu Kuwabara, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 94 days.

(21) Appl. No.: 13/055,829

(22) PCT Filed: Jul. 29, 2009

(86) PCT No.: PCT/JP2009/003573
§ 371 (c)(1),
(2), (4) Date: Jan. 25, 2011

(87) PCT Pub. No.: WO2010/023816
PCT Pub. Date: Mar. 4, 2010

(65) Prior Publication Data
US 2011/0117727 A1    May 19, 2011

(30) Foreign Application Priority Data

Aug. 28, 2008  (JP) .................................. 2008-219981

(51) Int. Cl.
*H01L 21/30*  (2006.01)
(52) U.S. Cl.
USPC ........... 438/458; 438/406; 438/459; 438/481; 257/E21.568
(58) Field of Classification Search
USPC ........... 438/406, 458–459, 481; 257/E21.568
See application file for complete search history.

(56) References Cited

U.S. PATENT DOCUMENTS

| 5,374,564 | A | 12/1994 | Bruel |
| 6,468,923 | B1 | 10/2002 | Yonehara et al. |
| 7,892,948 | B2 * | 2/2011 | Yagi .............................. 438/459 |
| 2004/0185638 | A1 | 9/2004 | Kakizaki et al. |
| 2009/0042364 | A1 | 2/2009 | Yagi |

FOREIGN PATENT DOCUMENTS

| CN | 1269599 A | 10/2000 |
| EP | 1 806 769 A1 | 7/2007 |
| EP | 1 978 543 A1 | 10/2008 |
| FR | 2 851 372 A1 | 8/2004 |
| JP | A 5-211128 | 8/1993 |

(Continued)

OTHER PUBLICATIONS

Extended European Search Report issued in European Patent Application No. 09809473.3 dated Aug. 29, 2011.

(Continued)

*Primary Examiner* — Minchul Yang
(74) *Attorney, Agent, or Firm* — Oliff & Berridge, PLC

(57) ABSTRACT

According to the present invention, there is provided a method for manufacturing an SOI wafer, the method configured to grow an epitaxial layer on an SOI layer of the SOI wafer having the SOI layer on a BOX layer to increase a thickness of the SOI layer, wherein epitaxial growth is carried out by using an SOI wafer whose infrared reflectance in an infrared wavelength range of 800 to 1300 nm falls within the range of 20% to 40% as the SOI wafer on which the epitaxial layer is grown. As a result, a high-quality SOI wafer with less slip dislocation and others can be provided with excellent productivity at a low cost as the SOI wafer including the SOI layer having a thickness increased by growing the epitaxial layer, and a manufacturing method thereof can be also provide.

4 Claims, 8 Drawing Sheets

FOREIGN PATENT DOCUMENTS

| | | |
|---|---|---|
| JP | A 2006-261346 | 9/2006 |
| JP | A-2006-261346 | 9/2006 |
| JP | A 2007-194539 | 8/2007 |
| WO | WO 2007/083587 A1 | 7/2007 |

OTHER PUBLICATIONS

Office Action issued in Japanese Patent Application No. 2008-219981, dated Sep. 28, 2010 (with partial English-language translation).

International Search Report issued in PCT/JP2009/003573, mailed Sep. 1, 2009. (with English-language translation).

International Preliminary Report on Patentability issued in International Application No. PCT/JP2009/003573 dated Apr. 12, 2011.

Jul. 4, 2012 Office Action issued in Chinese Patent Application No. 200980131333.5 (with partial English translation).

Jun. 11, 2012 Official Communication issued in European Patent Application No. 09809473.3.

* cited by examiner

FIG.7

AFTER H₂ ANNEALING (1100°C, 900 SECONDS)

| | POLISHED SILICON WAFER SLIP-FREE CONDITIONS | SOI WAFER A SLIP-FREE CONDITIONS |
|---|---|---|
| SOI WAFER A<br>SOI LAYER : 70nm<br>BOX LAYER : 145nm | | |
| SOI WAFER B<br>SOI LAYER : 50nm<br>BOX LAYER : 10nm | | |

| | AFTER H₂ ANNEALING | AFTER 5-mm EPITAXIAL GROWTH |
|---|---|---|
| SOI WAFER A<br>SOI LAYER : 70nm<br>BOX LAYER : 145nm |  |  |
| SOI WAFER C<br>SOI LAYER : 70nm<br>BOX LAYER : 340nm |  |  |

# METHOD FOR MANUFACTURING SOI WAFER AND SOI WAFER

TECHNICAL FIELD

The present invention relates to an SOI wafer having an SOI layer whose thickness is increased by growing a silicon epitaxial layer on the SOI layer of the SOI wafer serving as a substrate, and to a manufacturing method thereof.

BACKGROUND ART

As a method for fabricating an SOI wafer, a wafer bonding method and an SIMOX method are generally known. The wafer bonding method is a method of bonding, e.g., two silicon wafers through an oxide film without using an adhesive, increasing bonding strength by a heat treatment (1000 to 1200° C.), and then reducing a film thickness of one wafer based on, e.g., grinding/polishing or etching, and this technique is advantageous in that crystallinity of the SOI layer or reliability of a buried oxide film (a BOX layer) is equivalent to that of a regular silicon wafer but disadvantageous in that film thickness uniformity of the SOI layer has a limit (approximately ±0.3 μm at most) and its cost is high since two silicon wafers are used for manufacture of one SOI wafer.

Further, Patent Document 1 suggests an ion implantation and delamination method (which is also called a smart cut (a registered trademark) method) as one of the bonding methods. This method is a method of forming an oxide film on at least one of two silicon wafers, implanting at least one type selected from hydrogen ions and rare gas ions into one main surface of one wafer to form an ion implanted layer in the wafer, then closely attaching the ion implanted surface and one main surface of the other silicon wafer through the oxide film, and thereafter performing a heat treatment at a temperature of 300° C. to 600° C. or a higher temperature to effect delamination at the ion implanted layer, and this method has superiority in easily fabricating a thin SOI wafer having SOI layer film thickness uniformity of ±10 nm or below and superiority in reusing the delaminated bond wafer more than once to achieve a reduction in cost.

On the other hand, the SIMOX method is a method of implanting high-concentration oxygen ions into a silicon wafer to form an oxygen ion implanted layer, and then performing annealing processing at a high temperature of approximately 1300° C. to form a buried oxide film (a BOX layer) in the silicon wafer for using a layer on the surface side as an SOI layer. Although manufacture based on the SIMOX method is easy, the BOX layer formed from the oxygen ion implanted layer is restricted to the outermost surface layer and cannot be formed at a deep position of the wafer, and hence increasing a thickness of a surface layer device region is difficult. Furthermore, the formed BOX layer does not have a dense configuration, and this method has a drawback that a perfect dielectric strength voltage that is the greatest merit when using an SOI wafer as a device fabrication wafer is hardly obtained.

Meanwhile, although a thick SOI wafer having an SOI layer whose film thickness falls within the range of several μm to several-ten μm is a very useful wafer for a bipolar device or a power device, it is known that fabricating a high-quality SOI wafer at a low cost is difficult even though the bonding method using the grinding/polishing and the smart cut method. That is because, the bonding method using the grinding/polishing needs bonding a wafer having an oxide film and a bare wafer, carrying out a bonding heat treatment at 1100° C. or above, and performing grinding and polishing processing to obtain a desired SOI layer thickness, and hence the process becomes complicated and improving film thickness uniformity of the SOI layer is very difficult. On the other hand, in case of the smart cut method, a thickness of an SOI layer is determined based on a depth where ion implantation is possible (i.e., an acceleration voltage of an ion implantation device), a maximum acceleration voltage is approximately 200 keV in general implantation devices, and an SOI layer having a thickness of approximately 2 μm at most can be obtained.

CITATION LIST

Patent Document 1: Japanese Patent Application Laid-open No. 5-211128 (1993)
Patent Document 2: Japanese Patent Application Laid-open No. 2007-194539

DISCLOSURE OF INVENTION

Therefore, in view of the above-described problem, it is an object of the present invention to provide an SOI wafer having an SOI layer whose thickness is increased by growing an epitaxial layer, which is a high-quality SOI wafer having good productivity, a low cost, less slip dislocation, and others, and also provide a manufacturing method thereof.

To achieve this object, according to the present invention, there is provided a method for manufacturing an SOI wafer, the method configured to grow an epitaxial layer on an SOI layer of the SOI wafer having the SOI layer on a BOX layer to increase a thickness of the SOI layer, wherein epitaxial growth is carried out by using an SOI wafer whose infrared reflectance in an infrared wavelength range of 800 to 1300 nm falls within the range of 20% to 40% as the SOI wafer on which the epitaxial layer is grown.

As described above, in case of the SOI wafer having the infrared reflectance in the infrared wavelength range of 800 to 1300 mm falling within the range of 20% to 40%, this infrared reflectance is substantially equal to that of a polished silicon wafer. When growing the epitaxial layer on the SOI layer of such an SOI wafer, slip-free conditions such as lamp heating power balance at the time of epitaxial growth of the polished silicon wafer can be applied as they are. Therefore, a test for finding the slip-free conditions is not required, thereby greatly reducing a time. Furthermore, in the above-described SOI wafer, since a change in infrared reflectance due to a variation in layer thickness at the time of the epitaxial growth is very small, the epitaxial growth can be performed under optimum slip-free growth conditions from start to end of the epitaxial growth.

Therefore, the high-quality SOI wafer with a large film thickness that has the slip-free epitaxial layer formed thereon can be manufactured with excellent productivity at a low cost.

At this time, it is preferable to set a thickness of the BOX layer of the SOI wafer on which the epitaxial layer is grown to 30 nm or below or ((a positive integral multiple of 340)±20) nm.

In case of the SOI wafer having the BOX layer with such a thickness, the infrared reflectance in the infrared wavelength range of 800 to 1300 nm falls within the range of 20% to 40% irrespective of a thickness of the SOI layer. Therefore, when carrying out the present invention, adjusting the thickness of the BOX layer in the SOI wafer alone can suffice, and a fluctuation in reflectance due to a change in SOI layer thickness at the time of epitaxial growth is small, thus manufacturing the slip-free SOI wafer having a large film thickness with excellent productivity.

At this time, it is preferable to fabricate the SOI wafer on which the epitaxial layer is grown by implanting at least one of a hydrogen ion and rare gas ions from a surface of a bond wafer to form an ion implanted layer in the wafer, closely attaching the ion implanted surface of the bond wafer to a surface of a base wafer through an oxide film, and then delaminating the bond wafer at the ion implanted layer.

The SOI wafer fabricated by such an ion implantation delamination method has the SOI layer with the high film thickness uniformity, and hence growing the epitaxial layer on the SOI layer enables providing the SOI wafer having higher quality and a large film thickness.

At this time, it is preferable to grow the epitaxial layer by using a single-wafer processing lamp heating apparatus having an emission wavelength of an infrared lamp applied to the SOI wafer being restricted to 800 to 1300 nm.

Since setting the emission wavelength of the infrared lamp to the above-described range enables reducing the influence of the wavelength on the reflectance, the epitaxial layer can be grown in a state closer to the slip-free setting conditions.

At this time, it is preferable to grow the epitaxial layer to have a thickness larger than 1 µm.

As described above, when growing the epitaxial layer so as to have a relatively large thickness, the manufacturing method according to the present invention enables growing the epitaxial layer under the slip-free conditions from start to end of the epitaxial growth with almost no change in infrared reflectance due to a variation in layer thickness of the SOI even though a high temperature is maintained for a long time, which is preferable.

Furthermore, according to the present invention, there is provided an SOI wafer comprising: a base wafer formed of a silicon single crystal, a BOX layer on the base wafer, and an SOI layer on the BOX layer, wherein a thickness of the BOX layer is 30 nm or below or ((a positive integral multiple of 340)±20) nm, and the SOI layer comprises: a silicon single crystal layer on the BOX layer, and an epitaxial layer grown on the silicon single crystal layer.

According to the SOI wafer including the BOX layer having such a thickness, the infrared reflectance hardly changes at the time of forming the epitaxial layer on the silicon single crystal layer since the infrared reflectance in the infrared wavelength range of 800 to 1300 nm falls within the range of 20% to 40%, and the slip-free conditions of the polished silicon wafer can be applied as they are to assuredly grow the slip-free epitaxial layer with excellent productivity since the reflectance substantially equal to that of the polished silicon wafer is provided, thereby obtaining the high-quality SOI wafer at a low cost.

According to the present invention, when growing the epitaxial layer on the SOI layer of the SOI wafer to increase a thickness of the SOI layer, the high-quality SOI wafer with a large film thickness that has less slip dislocation and others can be manufactured with excellent productivity.

BRIEF DESCRIPTION OF THE DRAWINGS

FIG. 7 is a view showing slip occurrence situations based on power balance of a halogen lamp.

BEST MODE(S) FOR CARRYING OUT THE INVENTION

Figure 1:
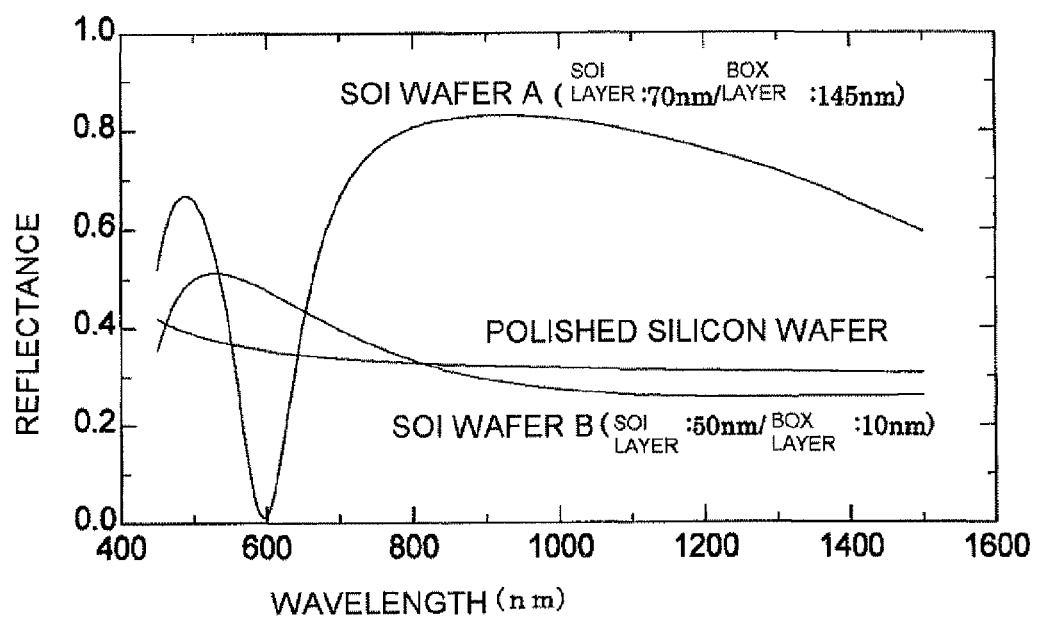
FIG. 1 is a graph showing reflectances of a polished silicon wafer and an SOI wafer.

In conventional examples, when epitaxial growth is carried out on an SOI layer of an SOI wafer serving as a substrate by using, e.g., a single-wafer processing lamp heating type epitaxial growth apparatus at a high temperature, there is a problem that slip dislocation is apt to occur on the wafer to degrade quality.

In regard to this problem, there is a method of performing epitaxial growth in such a manner that a reflectance of an SOI layer surface can fall within the range of 30% to 80% before the epitaxial growth and adjusting a thickness of each of a BOX layer and the SOI layer so as to obtain such a reflectance (Patent Document 2). However, even if the SOI wafer having the reflectance falling within this range is used, finding conditions that slip dislocation does not occur (slip free) and performing slip-free epitaxial growth are very difficult in some cases.

It is considered that a reason why such a situation occurs lies in that a thickness of the SOI layer is increased due to the epitaxial growth, an infrared reflectance is also changed, and epitaxial growth conditions that are optimum before the epitaxial growth are no longer optimum conditions, whereby the slip dislocation is apt to occur. In particular, when a thickness of the growing epitaxial layer exceeds 1 µm and reaches several µm to 10 µm or above, a high-temperature maintaining time in the epitaxial growth is prolonged, and the slip dislocation is further apt to occur.

It is considered that, when the infrared reflectance changes during the epitaxial growth, a temperature of a wafer surface (or a susceptor back surface) cannot be accurately measured, and an output of a lamp becomes unstable to deteriorate uniformity of an actual growth temperature, thus resulting in occurrence of the slip dislocation.

On the other hand, as a result of performing a simulation of an infrared reflectance with respect to a BOX layer thickness and an SOI layer thickness of an SOI wafer and carrying out examinations, the present inventors found that the SOI wafer having a specific infrared reflectance is substantially equivalent to a general polished silicon wafer used for device fabrication and the infrared reflectance is not affected by a thickness of an SOI layer on this wafer. Additionally, they found that an SOI wafer having a specific BOX layer thickness has the above-described infrared reflectance and arrived at the present invention.

That is, using the SOI wafer having this specific BOX layer thickness enables applying the epitaxial growth conditions (lamp heating power balance) equal to those of the polished silicon wafer, a test time required for finding out slip-free conditions when performing the epitaxial growth with respect to the SOI wafer can be greatly reduced, and the slip-free epitaxial growth can be carried out, thereby fabricating the high-quality SOI wafer at a low cost.

Further, at the time of performing the epitaxial growth, when a filter that passes a specific wavelength therethrough is utilized to restrict an emission wavelength of an infrared ray applied to the SOI wafer to 800 nm to 1300 nm, an influence of wavelengths that are not considered in the simulation can be reduced, whereby a result that is further close to a simulation result can be obtained.

An examination result obtained by the present inventors will now be described hereinafter in detail.

Figure 5:
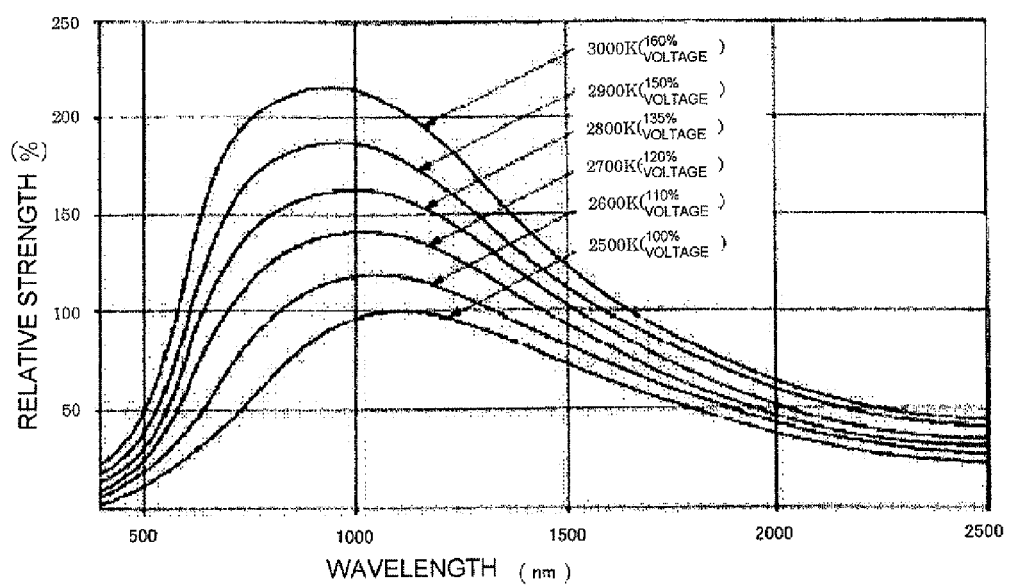
FIG. 5 is a graph showing spectral characteristics of a halogen lamp.

First, FIG. 5 shows spectral distribution characteristics of a halogen lamp used in a single-wafer processing lamp heating type epitaxial growth apparatus. Although emission is found in a wide infrared range, it can be understood that its peak wavelength is present in the vicinity of 1000 nm.

FIG. 1 is a view obtained by simulating infrared reflectances of a polished silicon wafer, an SOI wafer A (an SOI layer: 70 nm, a BOX layer: 145 nm), and an SOI wafer B (an SOI layer: 50 nm, a BOX layer: 10 nm). It can be understood from this drawing that an infrared reflectance of an SOI wafer largely changes in dependent on thicknesses of an SOI layer and a BOX layer and that an SOI wafer having a reflectance substantially equal to that of the polished silicon wafer is present like the SOI wafer B.

Figure 6:
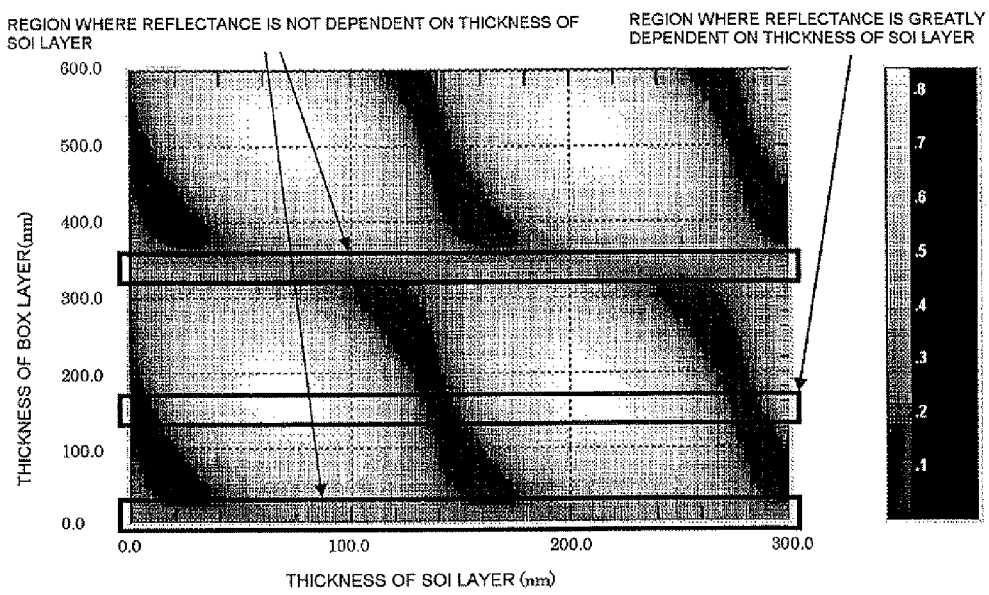
FIG. 6 is a view showing a relationship between thicknesses of an SOI layer and a BOX layer and reflectances.

FIG. 6 shows a result of simulating a reflectance of an SOI wafer with respect to a wavelength of 1000 nm as the peak wavelength of the halogen lamp with an SOI layer thickness and a BOX layer thickness being used as parameters.

It can be understood that the reflectance of the SOI wafer cyclically changes in accordance with the thicknesses of the SOI layer and the BOX layer and that the reflectance greatly changes depending on the thickness of the SOI layer, namely, a high reflectance of approximately 80% is provided in case of the SOI layer thickness of 70 nm but the reflectance is reduced to be approximately 10% or below in case of the SOI layer thickness of 140 nm when the BOX layer thickness is 145 nm like the SOI wafer A. Further, it was also understood that, in case of an SOI wafer having a BOX layer thickness of 10 nm like the SOI wafer B, the reflectance has a substantially fixed value of 30% to 40% even though a SOI layer thickness varies and it is substantially equal to the reflectance of the polished silicon wafer. Furthermore, a BOX layer thickness that provides a substantially fixed reflectance like the SOI wafer B even though the SOI layer thickness varies is cyclically present, and it was revealed that a thickness of the next cycle is close to 340 nm.

EXPERIMENTAL EXAMPLE

To confirm the simulation result, the polished silicon wafer, the SOI wafer A (the SOI layer: 70 nm, the BOX layer: 145 nm), and the SOI wafer B (the SOI layer: 50 nm, the BOX layer: 10 nm) each having a diameter of 300 mm were used to carry out $H_2$ annealing (in an $H_2$ gas 100% atmosphere) at 1100° C. for 900 seconds by a single-wafer processing lamp heating type epitaxial growth apparatus (Centura: manufactured by Applied Materials, Inc.). A slip occurrence situation was evaluated based on slip highlighted map display of a wafer stress measuring apparatus SIRD (Scanning InfraRed Depolarization).

First, in regard to the polished silicon wafer, lamp heating power balance (above and below the wafer, in or out of the wafer) conditions that provide a slip-free state after the $H_2$ annealing were obtained. FIG. 7 shows a result of performing the $H_2$ annealing with respect to the SOI wafers A and B under such conditions. The SOI wafer B whose reflectance is substantially equal to that of the polished silicon wafer was substantially free from slip, which is substantially equal to the polished silicon wafer, and, on the other hand, slip was observed at a wafer peripheral portion of the SOI wafer A.

On the other hand, in regard to the SOI wafer A, conditions that provide a slip-free state were obtained, and FIG. 7 also shows a result obtained by applying such conditions to the SOI wafer B, but it was revealed that slip considerably occurred at the wafer periphery and near the center of the SOI wafer B.

As described above, it was understood that the slip-free conditions of the SOI wafer differ depending on thicknesses of the SOI layer and the BOX layer and that the slip-free conditions of the polished silicon wafer can be applied to the SOI wafer B. This situation can be explained based on differences in infrared reflectance shown in FIG. 1. That is, it can be considered that the slip-free conditions differ since the polished silicon wafer and the SOI wafer B have substantially the same reflectances and the SOI wafer A has a reflectance that is considerably different from these reflectances.

Therefore, like the SOI wafer B, in case of an SOI wafer that has a reflectance (approximately 20% or above and 40% or below) substantially equal to that of the polished silicon wafer in a wavelength range of 800 nm to 1300 nm including a peak wavelength range of a halogen lamp used in the single-wafer processing lamp heating type epitaxial growth apparatus, it was found that a slip-free heat treatment can be carried out with respect to the SOI wafer by setting the same heat treatment conditions as heat treatment conditions that can obtain a slip-free state in the polished silicon wafer at the time of epitaxial growth or hydrogen annealing for removal of a natural oxide film immediately before the epitaxial growth, thereby bringing the present invention to completion.

Embodiments according to the present invention will now be specifically described hereinafter with reference to the drawings, but the present invention is not restricted thereto.

Figure 2:
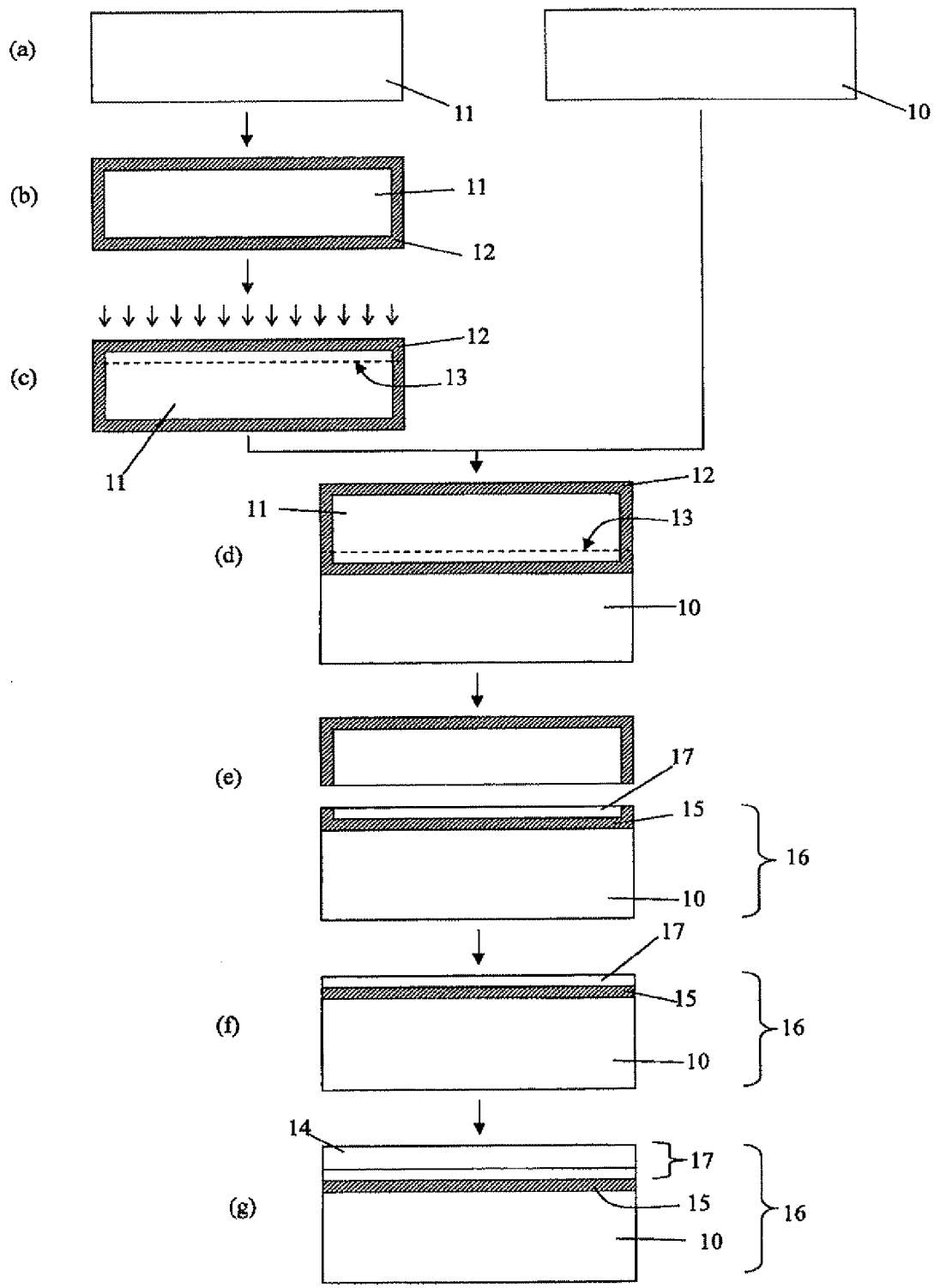
FIG. 2 is a flowchart as an example of an embodiment of a manufacturing method according to the present invention.
Figure 3:
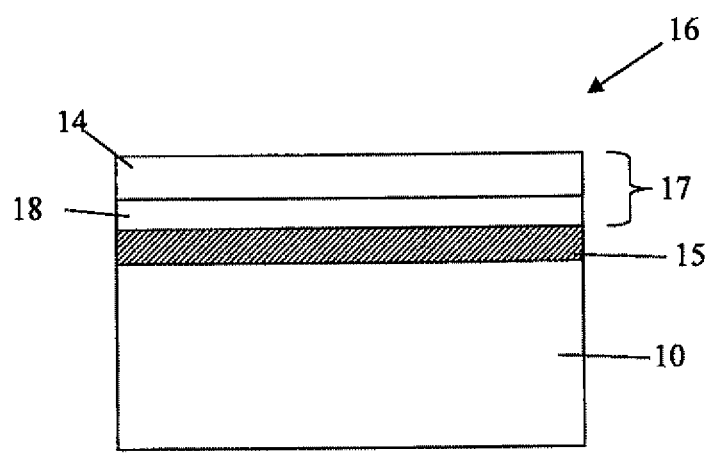
FIG. 3 is a schematic view showing an example of an SOI wafer according to the present invention.

FIG. 2 is a flowchart showing an example of an embodiment of a manufacturing method according to the present invention. FIG. 3 is a schematic view showing an example of an SOI wafer according to the present invention.

In the manufacturing method according to the present invention, as a substrate on which a silicon epitaxial layer is grown, an SOI wafer having an infrared reflectance of 20% or above and 40% or below in an infrared wavelength range of 800 to 1300 nm is first fabricated.

First, at a step (a) in FIG. 2, two silicon mirror finished wafers are prepared, namely, a base wafer 10 serving as a support substrate and a bond wafer 11 serving as an SOI layer that meet a specification of a device are prepared.

Then, at a step (b) in FIG. 2, at least one of these wafers, which is the bond wafer 11 in this example, is subjected to, e.g., thermal oxidation to form an oxide film 12 on a surface thereof. As the formation of this oxide film, a method such as CVD can be adopted.

At this time, it is preferable to adjust a thickness of the oxide film 12 in such a manner that a thickness of a BOX layer of an SOI wafer to be fabricated becomes 30 nm or below or ((a positive integral multiple of 340)±20) nm.

An SOI wafer having such a thickness of the BOX layer is an SOI wafer whose infrared reflectance in the infrared wavelength range of 800 to 1300 nm is 20% or above and 40% or below irrespective of an SOI layer thickness and others, thus easily fabricating the SOI wafer meeting requirements of the present invention.

Since the formed oxide film becomes the BOX layer of the SOI wafer that is to be fabricated, the oxide film is formed to have the same thickness as that described above when forming the oxide film on one wafer alone, or the oxide films are formed in such a manner that a value obtained by adding thicknesses of the oxide films becomes the above-described thickness when forming the oxide films on both the wafers. It is to be noted that, when the BOX layer has a thickness of 30 nm or below, its lower limit value is not restricted in particular, but setting this value to 5 nm or above in order to assure sufficient insulation properties.

Then, at a step (c) in FIG. 2, at least one type of ions, i.e., hydrogen ions or rare gas (e.g., He or Ne) ions are implanted into one surface of the bond wafer 11 to form an ion implanted layer 13 that is parallel to the surface at an average penetration depth of the ions.

Subsequently, at a step (d) in FIG. 2, a hydrogen ion implanted surface of the ion implanted bond wafer 11 and the base wafer 10 are superimposed and closely attached to each other through the oxide film 12. When the surfaces of the two wafers are brought into contact with each other in a clean atmosphere at an ordinary temperature, the wafers are bonded to each other without using an adhesive and others. However, an adhesive and others may be used in order to further securely bond the wafers to each other.

Then, at a step (e) in FIG. 2, the bond wafer 11 is delaminated with the ion implanted layer 13 being determined as a boundary, thereby fabricating an SOI wafer 16. For example, when a heat treatment is performed in, e.g., an inert gas atmosphere at a temperature of approximately 300 to 600° C., the bond wafer 11 can be delaminated at the ion implanted layer 13 due to crystal reorientation and air bubble agglomeration to provide the SOI wafer 16. It is to be noted that the delamination heat treatment may be omitted by increasing an ion implantation amount at the time of forming the ion implanted layer 13 for the delamination or by previously effecting a plasma treatment with respect to the surfaces to be superimposed and thereby activating the surfaces in some cases.

As described above, in the process shown in FIG. 2, the step of fabricating the SOI wafer serving as a substrate on which an epitaxial layer is grown is based on the ion implantation delamination method, but the fabrication of the SOI wafer is not restricted to the ion implantation delamination method, and the SOI wafer can be fabricated by any methods. For example, a method of implanting oxygen ions into the silicon wafer and then performing a heat treatment (an SIMOX method) may be used. Further, this method can be applied to the case where a film thickness is reduced by, e.g., grinding after bonding to manufacture the SOI wafer.

However, according to the ion implantation delamination method, since film thickness uniformity of the SOI layer is very high, when an epitaxial layer is grown on the SOI layer at a subsequent step, the SOI wafer having the higher-quality and thick SOI layer can be provided.

Subsequently, in the process shown in FIG. 2, after the delamination step, a bonding heat treatment step can be carried out at a step (f). At this step, if bonding strength of the wafers closely attached to each other at the steps (d) and (e), i.e., the adhesion step and the delamination heat treatment step is too weak to be used in a device process as it is, a high-temperature heat treatment may be performed with respect to the SOI wafer 16 as bonding heat treatment to obtain sufficient bonding strength. This heat treatment is performed in, e.g., an inert gas atmosphere at 1000 to 1200° C. in the range of 30 minutes to 2 hours.

After the above-described steps (a) to (f), the SOI wafer 16 whose infrared reflectance in the infrared wavelength range of 800 to 1300 nm is 20% or above and 40% or below is fabricated.

Subsequently, at a step (g) in FIG. 2, an epitaxial layer 14 is grown on an SOI layer 17 of the SOI wafer 16 serving as a substrate to increase a thickness of the SOI layer 17 to a desired thickness. The epitaxial layer 14 that has been through the epitaxial growth is integrated with the SOI layer 17 that is not subjected to the epitaxial growth to form the SOI layer 17 of the SOI wafer 16 that has been through the epitaxial growth. Moreover, before performing this epitaxial growth, hydrogen annealing may be carried out with respect to the SOI wafer 16 in the epitaxial growth apparatus to remove a natural oxide film on the surface of the SOI layer 17, and then the epitaxial growth may be performed.

According to such a method for manufacturing an SOI wafer by which the epitaxial layer is grown to increase the thickness of the SOI layer, since a layer thickness of the SOI layer varies as the epitaxial growth advances, the infrared reflectance changes, and the epitaxial growth under fundamentally optimum conditions is difficult, but the manufacturing method according to the present invention uses an SOI wafer whose infrared reflectance in the infrared wavelength range of 800 to 1300 nm is 20% or above and 40% or below, whereby the infrared reflectance does not change even though the layer thickness of the SOI layer changes and a temperature can be accurately measured. As a result, epitaxial growth conditions first set to the slip-free conditions can be maintained in the optimum state from start to end of the growth, and temperature adjustment can be accurately performed to effect the epitaxial growth.

Additionally, since the above-described infrared reflectance is a reflectance substantially equal to that of a polished silicon wafer, the epitaxial growth conditions of slip-free conditions of the polished silicon wafer can be applied as they are, and the slip-free conditions do not have to be examined in accordance with a difference in SOI layer or BOX layer, thereby greatly reducing a test time. Further, the slip-free conditions of the polished silicon wafer can be also applied to conditions for the hydrogen annealing before the epitaxial growth.

As described above, according to the manufacturing method of the present invention, the SOI wafer having the thick SOI layer with slip-free and high-quality can be manufactured with excellent productivity at a low cost.

Figure 4:
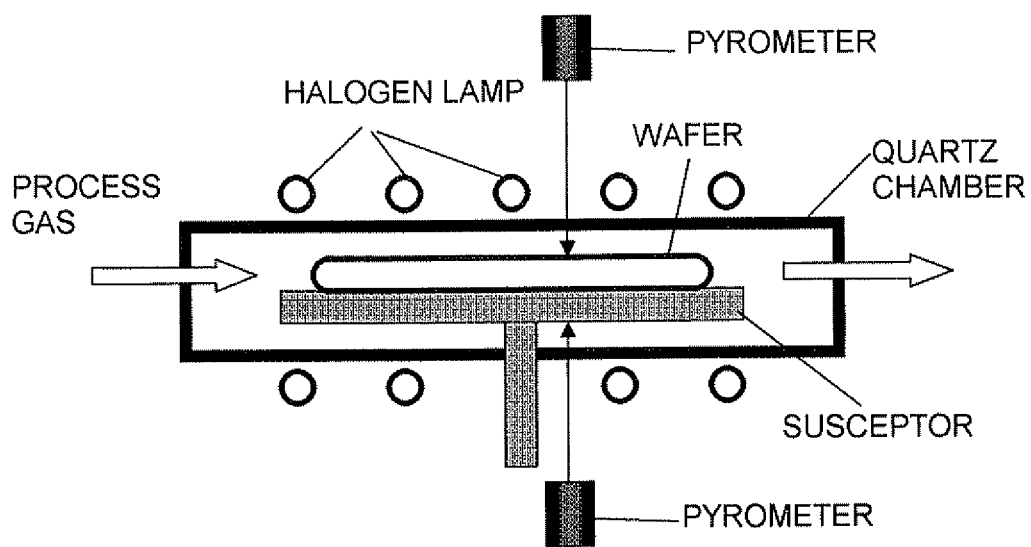
FIG. 4 is a schematic view of a single-wafer processing lamp heating epitaxial growth apparatus.

This epitaxial growth is performed by using, e.g., such a single-wafer processing lamp heating type epitaxial growth apparatus as shown in FIG. 4.

According to the epitaxial growth apparatus shown in FIG. 4, an SOI wafer that is to be subjected to epitaxial growth is mounted on a susceptor, a process gas is introduced into a quartz chamber, the wafer is heated by a halogen lamp (an infrared lamp) to an epitaxial growth temperature, a temperature of the heated wafer (or a susceptor back surface) is measured by a pyrometer, and the epitaxial growth is carried out while maintaining this temperature at a set temperature.

At this time, it is preferable to grow the epitaxial layer 14 by using a single-wafer processing lamp heater that an emission wavelength of the infrared lamp that is applied to the SOI wafer 16 is restricted to 800 to 1300 nm.

When the emission wavelength of the infrared lamp is restricted to the above-described range, an influence of the wavelength on a reflectance can be reduced, thus performing the epitaxial growth closer to the set epitaxial growth conditions.

Furthermore, a film thickness of the epitaxial layer 14 can be adjusted based on a flow volume of a gas, a reaction temperature, and a reaction time, and it is preferable to effect the growth in such a manner the film thickness exceeds 1 μm or reaches, e.g., 2 μm to 5 μm or a higher value.

Even if the epitaxial layer having a relatively large thickness is formed and a high-temperature maintaining time is prolonged, the manufacturing method according to the present invention enables performing the epitaxial growth under the optimum conditions from start to end of the growth, thereby carrying out the excellent epitaxial growth with no slip.

The above-described manufacturing method enables manufacturing, e.g., the SOI wafer 16 including the base wafer 10 formed of a silicon single crystal, the BOX layer 15 on the base wafer 10, and the SOI layer 17 on the BOX layer 15 shown in FIG. 3, wherein the BOX layer 15 has a thickness of 30 nm or below or ((a positive integral multiple of 340)±20) nm and the SOI layer 17 is formed of a silicon single crystal layer 18 on the BOX layer 15 and the epitaxial layer 14 grown on the silicon single crystal layer 18.

According to the SOI wafer including the BOX layer having such a thickness, since the infrared reflectance in the infrared wavelength range of 800 to 1300 nm becomes 20% or above and 40% or below, the infrared reflectance hardly changes when forming the epitaxial layer on the silicon single crystal layer, the reflectance substantially equal to that of a polished silicon wafer can be provided, and hence the slip-free conditions of the polished silicon wafer can be applied to assuredly grow the slip-free epitaxial layer with excellent productivity, thereby obtaining the high-quality SOI wafer at a low cost.

The present invention will now be more specifically explained based on examples of the present invention hereinafter, but the present invention is not restricted thereto.

Example

First, four wafers, i.e., an SOI wafer C (an SOI layer: 70 nm, a BOX layer: 340 nm), an SOI wafer D (an SOI layer: 50 nm, a BOX layer: 30 nm), an SOI wafer E (an SOI layer: 70 nm, a BOX layer: 360 nm), and an SOI wafer F (an SOI layer: 70 nm, a BOX layer: 320 nm) each having an infrared reflectance in an infrared wavelength range of 800 to 1300 nm falling within the range of 20% to 40% were prepared as epitaxial growth SOI wafers by the ion implantation delamination method.

Then, 5-μm silicon epitaxial growth was performed on each SOI layer by a single-wafer processing lamp heating type epitaxial growth apparatus (Centura). The silicon epitaxial growth was performed under conditions of 1100° C., a reduced pressure of 106.6 hPa, $H_2$: 40 slm, and $SiH_2Cl_2$: 450 sccm as non-doping epitaxy without introducing an impurity such as boron or phosphorus.

It is to be noted that, in regard to power balance of a heating lamp, optimum conditions for a regular polished silicon wafer (conditions possible to achieve a slip-free state after $H_2$ annealing) were determined, and the epitaxial growth was carried out while maintaining this balance. Further, a slip occurrence situation after the epitaxial growth was evaluated based on slip highlighted map display of a wafer stress measuring apparatus SIRD (Scanning InfraRed Depolarization).

Comparative Example

An SOI wafer A whose infrared reflectance is recognized to greatly change depending on an SOI thickness by a simulation (an SOI layer: 70 nm, a BOX layer: 145 mm) was prepared as an epitaxial growth SOI wafer, and 5-μm silicon epitaxial growth was performed on the SOI layer by using the single-wafer processing lamp heating type epitaxial growth apparatus (Centura).

Although silicon epitaxial growth conditions are the same as those of Example, in regard to power balance of the heating lamp, optimum conditions for the SOI wafer A (conditions possible to achieve a slip-free state after $H_2$ annealing) were determined, and the epitaxial growth was carried out while maintaining this balance. Further, a slip occurrence situation after the epitaxial growth was evaluated based on the slip highlighted map display of the wafer stress measuring apparatus SIRD (Scanning InfraRed Depolarization).

Figure 8:
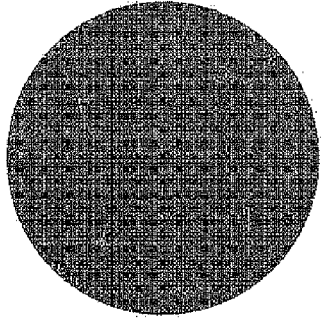
FIG. 8 is a view showing slip occurrence situations after annealing and after 5-µm epitaxial growth.
Figure 8:
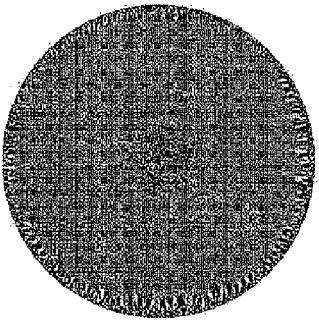
Figure 8:
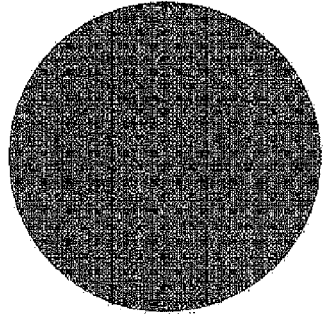
Figure 8:
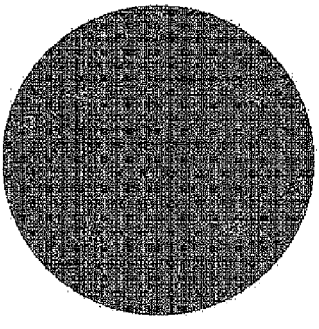

FIG. 8 shows the slip occurrence situations of the SOI wafer A and the SOI wafer C after the $H_2$ annealing and the slip occurrence situations after the 5-μm epitaxial growth on each SOI layer. In regard to the SOI wafer A (Comparative Example), temperature control was not able to be performed appropriately even under conditions that can avoid occurrence of slip at the time of the $H_2$ annealing immediately before the epitaxial growth since a reflectance cyclically fluctuates when the SOI layer thickness changes as shown in FIG. 6, whereby slip occurred after the epitaxial growth of 5 μm. On the other hand, in regard to the SOI wafer C (Example), since a reflectance hardly fluctuates when the SOI layer thickness changes, temperature control was performed appropriately and the excellent slip-free epitaxial growth was carried out.

Furthermore, in regard to the SOI wafers D, E, and F (Examples), the excellent slip-free epitaxial growth was carried out like the SOI wafer C.

It is to be noted that the present invention is not restricted to the foregoing embodiment. The foregoing embodiment is just an exemplification, and any examples that have substantially the same configurations and exercise the same functions and effects as the technical concept described in claims of the present invention are included in the technical scope of the present invention.

The invention claimed is:

1. A method for manufacturing an SOI wafer, the method comprising:
    growing an epitaxial layer on an SOI layer of the SOI wafer to increase a thickness of the SOI layer,
    wherein
        the SOI layer is on a BOX layer;
        epitaxial growth is carried out by using an SOI wafer whose infrared reflectance in an infrared wavelength range of 800 to 1300 nm falls within a range of 20% to 40% as the SOI wafer on which the epitaxial layer is grown;
        a thickness of the BOX layer of the SOI wafer on which the epitaxial layer is grown is 30 nm or below or ((a positive integral multiple of 340)+20) nm; and
        the epitaxial layer is grown to a thickness greater than 1 μm.

2. The method for manufacturing an SOI wafer according to claim 1, wherein the SOI wafer on which the epitaxial layer is grown is fabricated by implanting at least one of a hydrogen ion and rare gas ions from a surface of a bond wafer to form an ion implanted layer in the wafer, closely attaching the ion implanted surface of the bond wafer to a surface of a base wafer through an oxide film, and then delaminating the bond wafer at the ion implanted layer.

3. The method for manufacturing an SOI wafer according to claim 2, wherein the epitaxial layer is grown by using a single-wafer processing lamp heating apparatus having an emission wavelength of an infrared lamp applied to the SOI wafer being restricted to 800 to 1300 nm.

4. The method for manufacturing an SOI wafer according to claim 1, wherein the epitaxial layer is grown by using a single-wafer processing lamp heating apparatus having an emission wavelength of an infrared lamp applied to the SOI wafer being restricted to 800 to 1300 nm.

* * * * *